United States Patent
Zou et al.

(10) Patent No.: US 9,343,612 B2
(45) Date of Patent: May 17, 2016

(54) METHOD OF BONDING A SEMICONDUCTOR DEVICE TO A SUPPORT SUBSTRATE

(75) Inventors: Quanbo Zou, Eindhoven (NL); Salman Akram, Eindhoven (NL); Jerome Chanra Bhat, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 50 days.

(21) Appl. No.: 14/131,207

(22) PCT Filed: Jul. 10, 2012

(86) PCT No.: PCT/IB2012/053513
§ 371 (c)(1),
(2), (4) Date: Jan. 7, 2014

(87) PCT Pub. No.: WO2013/011415
PCT Pub. Date: Jan. 24, 2013

(65) Prior Publication Data
US 2014/0141552 A1  May 22, 2014

Related U.S. Application Data

(60) Provisional application No. 61/614,578, filed on Mar. 23, 2012, provisional application No. 61/508,211, filed on Jul. 15, 2011.

(51) Int. Cl.
*H01L 33/00* (2010.01)
*H01L 33/62* (2010.01)

(52) U.S. Cl.
CPC .......... *H01L 33/005* (2013.01); *H01L 33/0079* (2013.01); *H01L 33/62* (2013.01); *H01L 2224/16* (2013.01); *H01L 2924/1461* (2013.01)

(58) Field of Classification Search
CPC .................................................. H01L 33/0079
See application file for complete search history.

(56) References Cited

U.S. PATENT DOCUMENTS

| | | | |
|---|---|---|---|
| 6,876,008 B2 | 4/2005 | Bhat | |
| 2006/0006404 A1* | 1/2006 | Ibbetson | H01L 23/481 257/99 |
| 2007/0284602 A1* | 12/2007 | Chitnis | H01L 23/481 257/98 |
| 2008/0035935 A1* | 2/2008 | Shum | 257/79 |
| 2009/0179207 A1* | 7/2009 | Chitnis | H01L 33/44 257/88 |
| 2009/0283787 A1 | 11/2009 | Donofrio | |
| 2010/0047939 A1* | 2/2010 | Kamei | 438/27 |

FOREIGN PATENT DOCUMENTS

| | | |
|---|---|---|
| EP | 1385215 A2 | 1/2004 |
| JP | 2010103186 A | 5/2010 |
| JP | 2010103186 * | 6/2010 |

* cited by examiner

Primary Examiner — Mary Wilczewski
Assistant Examiner — Erik T Peterson

(57) ABSTRACT

A method according to embodiments of the invention includes providing a wafer of semiconductor devices grown on a growth substrate. The wafer of semiconductor devices has a first surface and a second surface opposite the first surface. The second surface is a surface of the growth substrate. The method further includes bonding the first surface to a first wafer and bonding the second surface to a second wafer. In some embodiments, the first and second wafer each have a different coefficient of thermal expansion than the growth substrate. In some embodiments, the second wafer may compensate for stress introduced to the wafer of semiconductor devices by the first wafer.

12 Claims, 3 Drawing Sheets

METHOD OF BONDING A SEMICONDUCTOR DEVICE TO A SUPPORT SUBSTRATE

CROSS-REFERENCE TO PRIOR APPLICATIONS

This application is the U.S. National Phase application under 35 U.S.C. §371 of International Application No. PCT/IB2012/053513, filed on Jul. 10, 2012, which claims the benefit of U.S. Provisional Application No. 61/508,211, filed on Jul. 15, 2011 and U.S. Provisional Application No. 61/614,578 filed on Mar. 23, 2012. These applications are hereby incorporated by reference herein.

FIELD OF THE INVENTION

The present invention relates to a method of attaching a semiconductor light emitting device such as a III-nitride light emitting diode to a support substrate.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 9 illustrates a light emitting diode die 110 attached to a submount 114, described in more detail in U.S. Pat. No. 6,876,008. Electrical connections between the solderable surfaces on the top and bottom surfaces of the submount are formed within the submount. The solderable areas on the top of the submount, on which solder balls 122-1 and 122-2 are disposed, are electrically connected to the solderable areas on the bottom of the submount, which attach to solder joint 138, by a conductive path within the submount. Solder joint 138 electrically connects solderable areas on the bottom of the submount to a board 134. Submount 114 may be, for example, a silicon/glass composite submount with several different regions. Silicon regions 114-2 are surrounded by metalizations 118-1 and 118-2, which form the conductive path between the top surface and the bottom surface of the submount. Circuitry such as ESD protection circuitry may be formed in the silicon regions 114-2 surrounded by metalizations 118-1 and 118-2, or in other silicon region 114-3. Such other silicon 114-3 regions may also electrically contact the die 110 or the board 134. Glass regions 114-1 electrically isolate different regions of silicon. Solder joints 138 may be electrically isolated by an insulating region 135 which may be, for example, a dielectric layer or air.

In the device illustrated in FIG. 9, the submount 114 including metalizations 118-1 and 118-2 is formed separately from die 110, before die 110 is attached to submount 114. For example, U.S. Pat. No. 6,876,008 explains that a silicon wafer, which is comprised of sites for many submounts, is grown to include any desired circuitry such as the ESD protection circuitry mentioned above. Holes are formed in the wafer by conventional masking and etching steps. A conductive layer such as a metal is formed over the wafer and in the holes. The conductive layer may then be patterned. A layer of glass is then formed over the wafer and in the holes. Portions of the glass layer and wafer are removed to expose the conductive layer. The conductive layer on the underside of the wafer may then be patterned and additional conductive layers may be added and patterned. Once the underside of the wafer is patterned, individual LED dice 110 may be physically and electrically connected to the conductive regions on the submount by interconnects 122. In other words, the LEDs 110 are attached to the submount 114 after being diced into individual diodes.

SUMMARY

It is an object of the invention to provide a wafer-scale method for attaching a wafer of semiconductor devices to a support substrate wafer where warp in the wafer of semiconductor devices is kept small enough that the wafer of semiconductor devices can be processed after being attached to the support substrate wafer.

A method according to embodiments of the invention includes providing a wafer of semiconductor devices grown on a growth substrate. The wafer of semiconductor devices has a first surface and a second surface opposite the first surface. The second surface is a surface of the growth substrate. The method further includes bonding the first surface to a first wafer and bonding the second surface to a second wafer. In some embodiments, the first and second wafer each have a different coefficient of thermal expansion than the growth substrate. In some embodiments, the second wafer may compensate for stress introduced to the wafer of semiconductor devices by the first wafer.

DETAILED DESCRIPTION

In embodiments of the invention, a semiconductor light emitting device is bonded to a mount in a wafer scale process.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
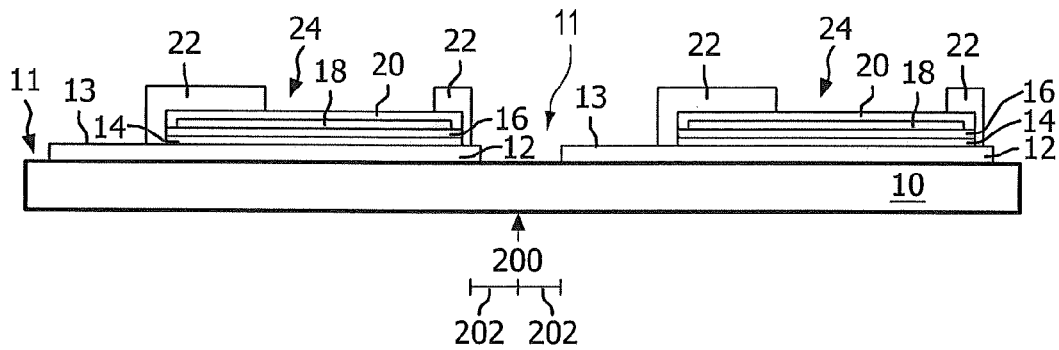
FIG. 1 illustrates a portion of a wafer of semiconductor light emitting devices. Two light emitting devices are illustrated in FIG. 1.

FIG. 1 illustrates a portion of a wafer of semiconductor light emitting devices. Two devices are illustrated in FIG. 1. To form the structure illustrated in FIG. 1, a semiconductor structure is grown over a growth substrate which may be any suitable substrate 10 such as, for example, sapphire, SiC, Si, GaN, or composite substrates. The semiconductor structure includes a light emitting or active region 14 sandwiched between n- and p-type regions 12 and 16. An n-type region 12 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical or electrical properties desirable for the light emitting region to efficiently emit light. A light emitting or active region 14 is grown over the n-type region 12. Examples of suitable light emitting regions include a single thick or thin light emitting layer, or a multiple quantum well light emitting region including multiple thin or thick light emitting layers separated by barrier layers. A p-type region 16 may then be grown over the light emitting region 14. Like the n-type region 12, the p-type region 16 may include multiple layers of different composition, thickness, and dopant concentration, including layers that are not intentionally doped, or n-type layers. The total thickness of all the semiconductor material in the device is less than 10 μm in some embodiments and less than 6 μm in some embodiments. In some embodiments the p-type region is grown first, followed by the active region, followed by the n-type region. In some embodiments, the semiconductor material may optionally be annealed at between 200° C. and 800° C. after growth.

A metal contact on the p-type region 16 is formed. In the device of FIG. 1, the p-contact includes two metal layers 18 and 20. Metal 18 may be deposited by, for example, evaporation or sputtering, then patterned by standard photolithographic operations including, for example, etching or lift-off. Metal 18 may be a reflective metal that makes an ohmic contact with p-type III-nitride material such as, for example, silver. Metal 18 may also be a multi-layer stack of a transition metal and silver. The transition metal may be, for example, nickel. Metal 18 is between 100 Å and 2000 Å thick in some embodiments, between 500 Å and 1700 Å thick in some embodiments, and between 1000 Å and 1600 Å in some embodiments. The structure may optionally be annealed a second time after deposition of metal 18.

An optional second p-contact metal 20 may be deposited over p-contact metal 18 by, for example, evaporation or sputtering, then patterned by standard photolithographic operations such as, for example, etching or lift-off. Metal 20 may be any electrically-conductive material which reacts minimally with silver, such as, for example, an alloy of titanium and tungsten. This alloy may be nitrided either partially, wholly, or not at all. Metal 20 may alternatively be chromium, platinum or silicon, or may be a multi-layer stack of any of the above materials optimized for adhesion to surrounding layers and for blocking diffusion of metal 18. Metal 20 may be between 1000 Å and 10000 Å thick in some embodiments, between 2000 Å and 8000 Å in some embodiments, and between 2000 Å and 7000 Å thick in some embodiments.

The structure is then patterned by standard photolithographic operations and etched by, for example, reactive ion etching (RIE), where chemically reactive plasma is used to remove the semiconductor material, or inductively coupled plasma (ICP) etching, an RIE process where the plasma is generated by an RF-powered magnetic field. In some embodiments, the pattern is determined by the photolithographic mask used to pattern p-contact metal 20. In these embodiments, etching may be performed subsequent to etching of p-contact metal 20 in a single operation. In some regions, the entire thickness of p-type region 16 and the entire thickness of light emitting region 14 are removed, revealing a surface 13 of n-type region 12. The n-type region 12 is then etched away in regions 11 between devices, revealing the growth substrate 10, such that the III-nitride material is set back from the point 200, the edge of the final device, by a distance 202 i.e. the distance of exposed substrate 10 between devices is twice the distance 202. In some embodiments, neighboring devices are separated by sawing, for example, in region 11. For example, the III-nitride material may be set back from the edge of the device by between 1 μm and 50 μm in some embodiments, by less than 20 μm in some embodiments, by less than 10 μm in some embodiments, and by less than 6 μm in some embodiments.

A dielectric 22 may be deposited over the structure in FIG. 1, for example by plasma-enhanced chemical vapor deposition (PECVD), chemical vapor deposition (CVD), or evaporation. Dielectric 22 provides electrical isolation for the metal contacts connected to the n-type and p-type regions. Dielectric 22 is patterned by standard photolithographic operations and etched by ICP etching or RIE to expose n-type region 12 in regions 13 and to expose p-contact metal 20 in regions 24. Dielectric 22 may also be patterned by lift-off. Dielectric 22 may be any suitable dielectric including silicon nitride, silicon oxide and silicon oxy-nitride. In some embodiments, dielectric 22 is a multi-layer dielectric stack optimized to reflect light incident upon it. Dielectric 22 may be less than 2 μm thick in some embodiments, between 200 Å and 5000 Å thick in some embodiments, and between 500 Å and 3200 Å thick in some embodiments.

Two devices are shown in FIG. 1, to illustrate that the devices described herein are formed on a wafer of devices. For simplicity, only one device is shown in the following figures, though it is to be understood that the structures shown in those figures are repeated across a wafer.

Figure 2:
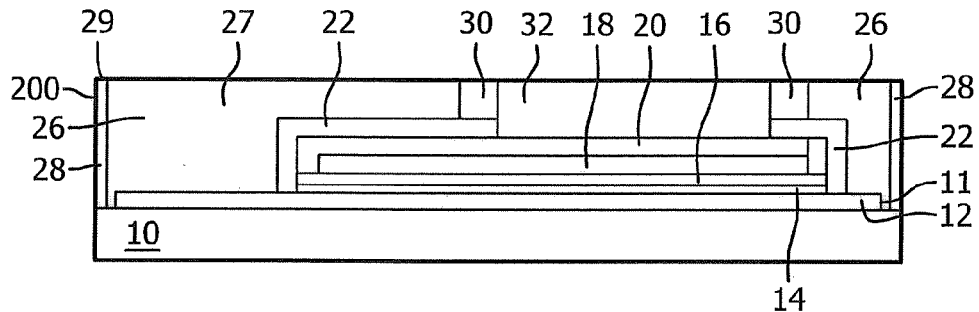
FIG. 2 illustrates one of the devices of FIG. 1 after addition of one or more metal layers and one or more polymer layers.

In FIG. 2, a metal layer 27 that forms n-contact 26 in the regions where it contacts n-type region 12 and an additional p-contact layer 32 is deposited and patterned. Metal 27 may be any suitable metal including aluminum or a multi-layer stack of metals including aluminum, titanium-tungsten alloy, copper and gold. In embodiments where metal 27 is a multi-layer stack, the first metal (i.e. the metal adjacent to n-type region 12) may be selected to form an ohmic contact to GaN and to be reflective of blue and white light. Such a first layer may be, for example, aluminum.

Figure 3:
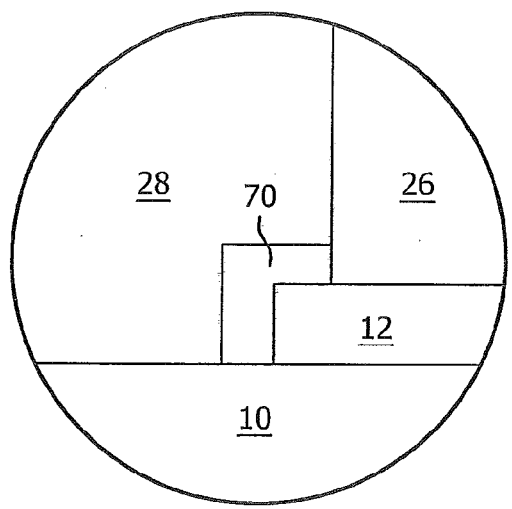
FIG. 3 illustrates a reflector formed on the edge of an n-type region.

Though in the device illustrated in FIG. 2, n-contact 26 extends over the edge of n-type region 12 and touches growth substrate 10, in some embodiments, n-contact 26 may be set back from the edge of n-type region 12 such that n-contact 26 does not cover the edge of n-type region 12. In such embodiments, polymer layer 28, described below, may be wider, such that it touches a portion of n-type region 12 not covered by n-contact 26. In some embodiments, as illustrated in FIG. 3 which shows a portion of a device, a reflective dielectric material 70 is deposited around the edges of n-type region 12. Reflective dielectric material 70 may be, for example, a reflective dielectric stack formed at the same time as dielectric 22 or formed in separate deposition and patterning steps. In any case, both n-type region 12 and n-contact 26 are set back from the edge 200 of the device.

One or more polymer layers are then deposited and patterned. Polymer layer 28 is disposed between adjacent devices. Polymer layer 30 separates p-contact 32 from n-contact 26. Polymer layers 28 and 30 may be the same material and may be deposited and patterned in the same operation, though they need not be. In some embodiments polymer layers 28 and 30 are resistant to high temperatures. Examples of suitable materials include benzo-cyclobutene-based polymers, polyimide-based polymers, silicone-based polymers, and epoxies. In some embodiments, polymer layer 28 is doped with a scattering component such as titanium dioxide or a light absorbing material such as carbon black. The deposited polymer layers 28 and 30 may be planarized, for example by chemical-mechanical polishing, mechanical polishing, or fly-cutting.

The devices illustrates in FIGS. 1 and 2 are just one example of a device that may be used with embodiments of the invention. Any suitable device may be used with embodiments of the invention—embodiments of the invention are not limited to the details illustrated in FIGS. 1 and 2. For example, though FIGS. 1 and 2 illustrate a flip-chip device, embodiments of the invention may be used with other device geometries and are not limited to flip-chip devices.

Figure 4:
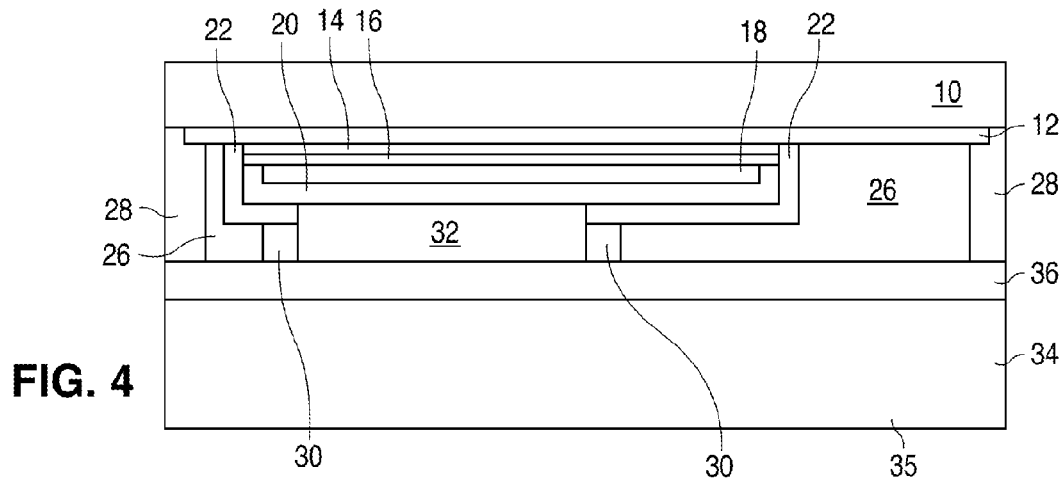
FIG. 4 illustrates the structure of FIG. 3 bonded to a support substrate.

A wafer of the devices illustrated in FIG. 2 is flipped relative to the orientation illustrated in FIG. 2 and bonded to a wafer of support substrates, as illustrated in FIG. 4. The support substrate 34 illustrated in FIG. 4 includes a body 35. Body 35 may be Si, GaAs, or Ge in some embodiments, or any other suitable material. In some embodiments, electronics can be integrated into support substrate 34. Integrated elements may include, for example, circuit elements used for electrostatic discharge protection or drive electronics. Examples of suitable integrated elements include diodes, resistors, and capacitors. Integrated elements may be formed by conventional semiconductor processing techniques. Body 35 may be, for example, at least 100 μm thick in some embodiments, no more than 400 μm thick in some embodiments, at least 150 μm thick in some embodiments, and no more than 250 μm thick in some embodiments.

Prior to bonding, a bonding layer 36 is formed on one or both of the wafer of devices and the wafer of support substrates. Bonding layer 36 may be, for example, a polymer, other organic material, benzo-cyclobutene-based polymer, polyimide-based polymer, silicone-based polymer, or epoxy suitable for use as a bonding material or glue. Bonding layer 36 may be the same material as polymer layers 28 and/or 30, though it need not be. Bonding layer 36 may be formed by, for example, spin coating. After forming bonding layer 36 and before bonding, bonding layer 36 may be planarized, for example by chemical-mechanical polishing, mechanical polishing, or fly-cutting. In some embodiments, bonding layer 36 is omitted and the wafer of support substrates is directly bonded to the wafer of devices.

The wafer of devices and wafer of support substrates are then bonded together, often at elevated temperature. Bonding may be performed at a temperature of at least 50° C. in some embodiments, no more than 400° C. in some embodiments, at least 100° C. in some embodiments, no more than 350° C. in some embodiments, at least 200° C. in some embodiments, and no more than 300° C. in some embodiments. Compressive pressure may be applied during bonding in some embodiments. For example, a pressure less than 60 MPa may be applied to the wafer of devices and the wafer of support substrates.

As the bonded structure cools down after bonding, a difference in the coefficient of thermal expansion (CTE) between the wafer of support substrates and the growth substrate for the devices may cause the bonded structure to warp. For example, in the case of a silicon-based support substrate and III-nitride LEDs grown on a sapphire growth substrate, bonded structures warped 400 μm have been observed. Such a large warp may render the structure unprocessable by standard wafer fabrication equipment.

Embodiments of the invention include methods and structures for counteracting the warp that occurs during cooldown from wafer-scale bonding.

Figure 5:
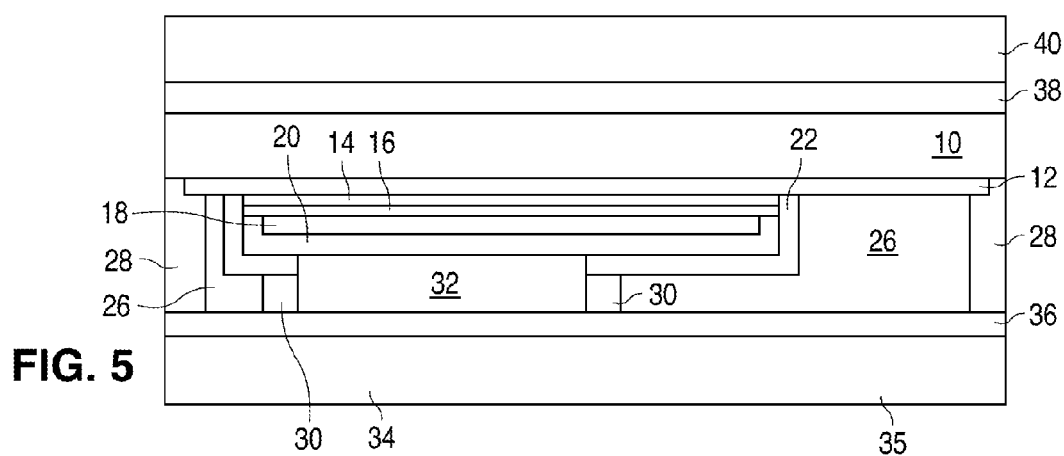
FIG. 5 illustrates the structure of FIG. 4 bonded to a stress-compensating layer.

In some embodiments, a second wafer is bonded to the side of the growth substrate opposite the device structure (the top of the growth substrate in the orientation illustrated in FIG. 4), as illustrated in FIG. 5. The wafer 40 bonded to the growth substrate wafer 10 may reduce or eliminate warping by balancing the stress introduced into the structure during cooldown from the elevated bonding temperature. The wafer 40 bonded to the growth substrate wafer 10 may be referred to herein as the stress-compensating layer or stress-compensating wafer, to distinguish it from the support substrate 34.

The stress-compensating layer 40 may be bonded to the growth substrate 10 by any suitable bonding technique such as, for example, anodic bonding, fusion bonding, or polymer bonding. To form a polymer bond, prior to bonding, a bonding layer 38 is formed on one or both of the growth substrate on which the devices are grown and the stress-compensating layer. Bonding layer 38 may be a polymer that is able to withstand the temperatures associated with any processing performed after bonding the wafer of devices to the stress-compensating wafer. In some embodiments, bonding layer 38 is a temporary bonding material. Suitable temporary bonding materials are available, for example, from Brewer Scientific. With a temporary bonding material, the stress-compensating wafer can be later debonded from the growth substrate, for example by heating the structure until the stress-compensating wafer can be slid off the growth substrate. In some embodiments, bonding layer 38 is omitted and the stress-compensating wafer is directly bonded to the wafer of semiconductor devices.

In some embodiments, the wafer of devices is bonded to support substrate wafer 34 and stress-compensating wafer 40 simultaneously. A three wafer stack is formed: the wafer of devices is sandwiched between the support substrate wafer and the stress-compensating wafer. Simultaneous bonding may minimize warpage of the wafer of devices and reduces the number of processing steps, which may reduce the cost of producing each device.

In some embodiments, the stress-compensating wafer 40 is bonded to growth substrate 10 after the wafer of devices is bonded to the wafer of support substrates, or before the wafer of devices is bonded to the wafer of support substrates.

In some embodiments, stress-compensating wafer 40 is the same material and same thickness as the support substrate 34. For example, stress-compensating wafer 40 may be a silicon wafer at least 100 μm thick in some embodiments, no more than 3 mm thick in some embodiments, at least 150 μm thick in some embodiments, no more than 2 mm thick in some embodiments, at least 200 μm thick in some embodiments, and no more than 1.5 mm thick in some embodiments. In some embodiments, stress-compensating wafer 40 is a different material from support substrate 34. Stress-compensating wafer 40 may be any material capable of withstanding the temperature required for bonding and of appropriate thickness and CTE to balance the stress caused by support substrate 34. In some embodiments, support substrate 34 is a silicon wafer and stress-compensating wafer 40 is, for example, glass, silicon, silica, sapphire, SiC, AlN, GaAs, quartz, ceramic, metal, alloy, rigid polymers or plastics, or any other suitable material.

The amount of stress compensation provided by the stress-compensating wafer depends on the thickness of the stress-compensating wafer and the CTE of the stress-compensating wafer, as compared to the thickness and CTE of the support substrate wafer. If the stress-compensating wafer 40 is a material with a lower CTE than the support substrate wafer, the stress-compensating wafer must be thicker than the support substrate wafer in order to reduce or eliminate warp caused by the support substrate wafer. If the stress-compensating wafer 40 is a material with a higher CTE than the support substrate wafer, the stress-compensating wafer must be thinner than the support substrate wafer in order to reduce or eliminate warp caused by the support substrate wafer. Appropriate thicknesses for the stress compensating wafer can be calculated according to the following equation (1):

$$[(CTE_{growth}-CTE_{stresscomp})(T_{bond1}-T_{room})(E_{stresscomp})]/[(1-v_{stresscomp})(t_{stresscomp})]=[(CTE_{growth}-CTE_{support})(T_{bond2}-T_{room})(E_{support})]/[(1-v_{support})(t_{support})],$$

where $CTE_{growth}$ is the CTE of the growth substrate (about 5.8 ppm/° C. for sapphire), $CTE_{stresscomp}$ is the CTE of the stress-compensating wafer (about 2.6 ppm/° C. for Si), $CTE_{support}$ is the CTE of the support substrate wafer, $T_{room}$ is room temperature, often 25° C., $T_{bond1}$ is the temperature of the bond between the wafer of devices and the stress-compensating wafer, $T_{bond2}$ is the temperature of the bond between the wafer of devices and the support substrate wafer, $E_{stresscomp}$ is the Young's modulus of the stress-compensating wafer, $E_{support}$ is the Young's modulus of the support substrate wafer, $v_{stresscomp}$ is the Poisson's ratio of the stress-compensating wafer, $v_{support}$ is the Poisson's ratio of the support substrate wafer, $t_{stresscomp}$ is the thickness of the stress-compensating wafer, and $t_{support}$ is the thickness of the support substrate wafer. In order for the bonded stack including the wafer of devices, the support substrate wafer, and the stress-compensating wafer to have balanced stresses such that stack remains flat during cool down, the two sides of equation (1) should be equal. In some embodiments, a small amount of stress can be tolerated in the bonded stack. For example, the two sides of equation 1 may differ no more than 10% in some embodiments, no more than 5% in some embodiments, and no more than 1% in some embodiments.

In some embodiments, the stress-compensating wafer is bonded to the growth substrate with a temporary bonding material that has a lower bonding temperature than the permanent bonding material used to bond the wafer of devices to the wafer of support substrates. As a result, even if the stress-compensating wafer, wafer of devices, and wafer of support substrates are bonded simultaneously, once the higher bond temperature of the permanent bonding material is reached, the stress between the wafer of devices and the wafer of support substrates is locked in. As the structure continues to cool, the stress-compensating wafer shrinks independently of the wafer of devices, and is therefore unable to compensate for the locked-in stress from the wafer of support substrates, until the lower bonding temperature of the temporary bonding material is reached and the temporary bonding material solidifies. In the case where the support substrate wafer and the stress-compensating wafer are the same material and the same thickness, the stress-compensating wafer will not entirely eliminate the warping caused by the support substrate wafer due to the difference in bonding temperature.

To compensate for the lower bonding temperature, in some embodiments where the stress-compensating wafer and the support substrate wafer are the same material, the stress-compensating wafer 40 is thicker than the body 35 of the wafer of support substrates 34. Similarly, if the stress-compensating wafer is bonded at a higher bonding temperature than the support substrate wafer, in some embodiments where the stress-compensating wafer and the support substrate wafer are the same material, the stress-compensating wafer is thinner than the support substrate. Appropriate thicknesses for the stress compensating wafer can be calculated according to equation (1) above. In embodiments where both the stress-compensating wafer and the support substrate wafer are silicon, the stress-compensating wafer is bonded with temporary bonding material available from Brewer Scientific, and the support substrate wafer is bonded with benzo-cyclobutene-based polymer, the stress compensating wafer may be, for example, seven times thicker than the support substrate wafer.

Figure 6:
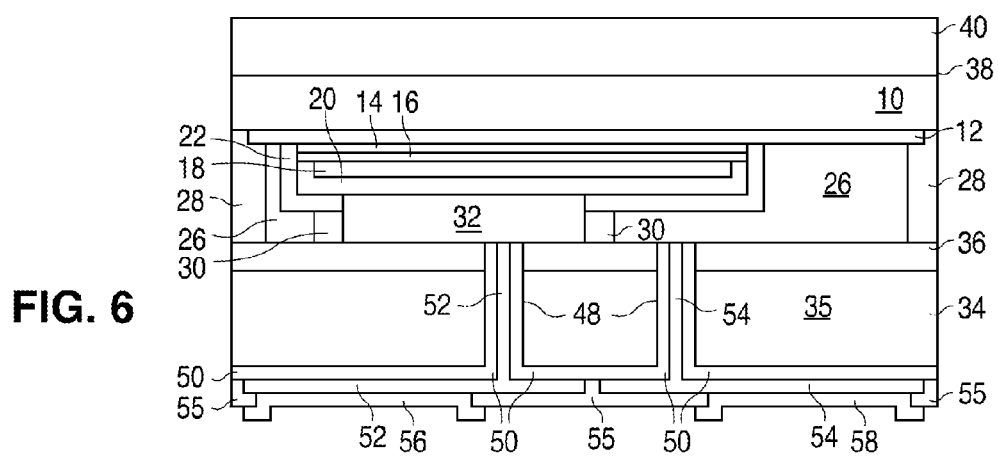
FIG. 6 illustrates the structure of FIG. 5 after forming vias in the support substrate.

After bonding, as illustrated in FIG. 6, vias 48 are etched through body 35 of support substrate 34. Two vias are illustrated, one that reveals a metal electrically connected to the n-type region 12 and one that reveals a metal electrically connected to the p-type region 16. In the device illustrated in FIG. 6, vias 48 are etched through body 35 and bonding layer 36 to reveal metal layers 32 and 26. Vias 48 may be etched by, for example, deep reactive ion etching, reactive ion etching, wet chemical etching, or any other suitable etching technique. In embodiments where support substrate 34 is Si, suitable etchant gases include, for example, $SF_6$ and etching may be time-multiplexed with deposition of a chemically inert passivation layer on the Si sidewalls using, for example, octafluorocyclobutane in a process commonly referred to as the Bosch Process. In embodiments where support substrate 34 is GaAs, suitable etchant gasses include, for example, $Cl_2$, HBr or a mixture of $Cl_2$ and HBr. In embodiments where support substrate 34 is Ge, suitable etchant gasses include, for example, $Cl_2$, $SCl_4$ or a mixture of $Cl_2$ and $SCl_4$. In embodiments where support substrate 34 is GaAs or Ge, etching may also be time-multiplexed with deposition of a chemically inert passivation layer on the sidewalls. The sidewalls of vias 48 may be orthogonal with respect to body 35, as shown in FIG. 6, or angled.

A dielectric 50 is deposited on the surface of body 35 and in vias 48. Dielectric 50 may be, for example, an oxide of silicon, a nitride of silicon, or an oxy-nitride of silicon deposited at low temperature, for example by PECVD. For example, PECVD oxide may be deposited at a temperature of 150° C. to 400° C. in an atmosphere of silane and $N_2O$ or $O_2$, or tetraethyl orthosilicate and $N_2O$ or $O_2$. Dielectric 50 may be between 100 Å and 2 μm thick in some embodiments. Dielectric 50 is subsequently patterned to expose the metal layers 32 and 26 at the top of vias 48.

A metal layer is deposited then patterned to form electrical connections 52 and 54 to the p- and n-contacts. Electrical connections 52 and 54 may be between 1 μm and 20 μm thick in some embodiments and between 6 μm and 10 μm thick in some embodiments. Vias 48 may be fully filled by electrical connections 52 and 54, as illustrated in FIG. 6, though they need not be. The metal layer that forms electrical connections 52 and 54 may be a metal such as, for example, Cu, or a multi-layer metal stack comprising, for example Ti, TiW, Cu, Ni, and Au, deposited by sputtering, plating, or by a combination of sputtering and plating.

A dielectric 55 is deposited and patterned to electrically isolate and/or protect electrical connections 52 and 54. Dielectric 55 may be, for example, one or more benzo-cyclobutene based polymers or one or more polyimide-based polymers. In embodiments where vias 48 have not been completely filled by the metal layer forming electrical connections 52 and 54, dielectric 55 may be configured to mostly or totally fill vias 48, or vias 48 may be left unfilled.

Optionally, an additional metal layer is then deposited to form solder connections 56 and 58. Examples of suitable structures for solder connections 56 and 58 include a first layer of sputtered NiV or plated Ni followed by a second thin layer of sputtered or plated Au, a first layer of sputtered TiW followed by a second layer of sputtered NiV or plated Ni followed by a third thin layer of sputtered or plated Au, or a first layer of sputtered or plated TiW followed by a second layer of plated Cu followed by a third layer of sputtered or plated Au. Solder connections 56 and 58 may have a total thickness between 1 µm and 15 µm in some embodiments.

The processing described above in reference to FIG. 6 is done with the stress-compensating wafer 40 attached to the wafer of light emitting devices, in some embodiments.

Figure 7:
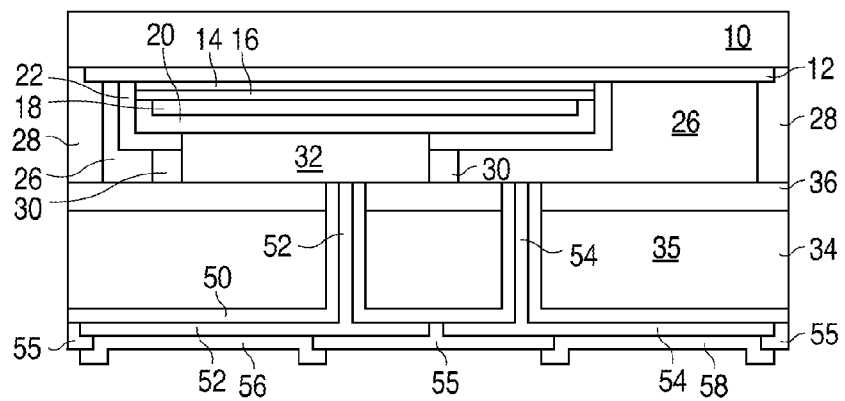
FIG. 7 illustrates the structure of FIG. 6 after removing the stress-compensating layer.

After the processing illustrated in FIG. 6, the stress-compensating wafer 40 may be removed, as illustrated in FIG. 7. Stress-compensating wafer 40 may be removed by any technique that is appropriate to the wafer material and the bonding layer material. For example, a silicon or other stress-compensating wafer 40 bonded with a bonding layer 38 of temporary bonding material may be removed by heating the structure until the temporary bonding material softens, then sliding or lifting the stress-compensating wafer off the growth substrate. A stress-compensating wafer 40 that is bonded using a permanent bonding material may be removed by a mechanical technique such as grinding or by etching. In some embodiments, stress-compensating wafer 40 is not removed.

After removing the stress-compensating wafer 40, any residual material from bonding layer 38 may be removed by any technique appropriate to the bonding layer material. For example, temporary bonding material from Brewer Science may be removed by rinsing the structure in bond remover available from Brewer Science. Alternatively, bonding layer material may be removed by, for example, rinsing or otherwise exposing the structure of FIG. 7 to appropriate solvents, liquid etching, or plasma etching in $O_2$, $CF_4$, or a combination of $O_2$ and $CF_4$.

Figure 8:
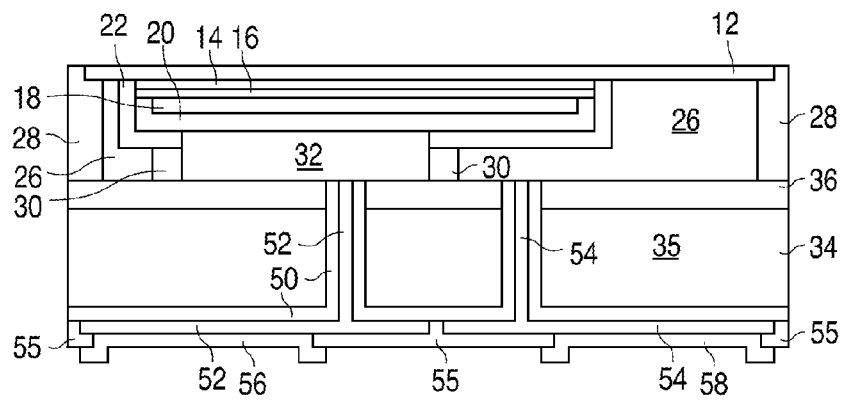
FIG. 8 illustrates the structure of FIG. 7 after optionally removing the growth substrate.
Figure 9:
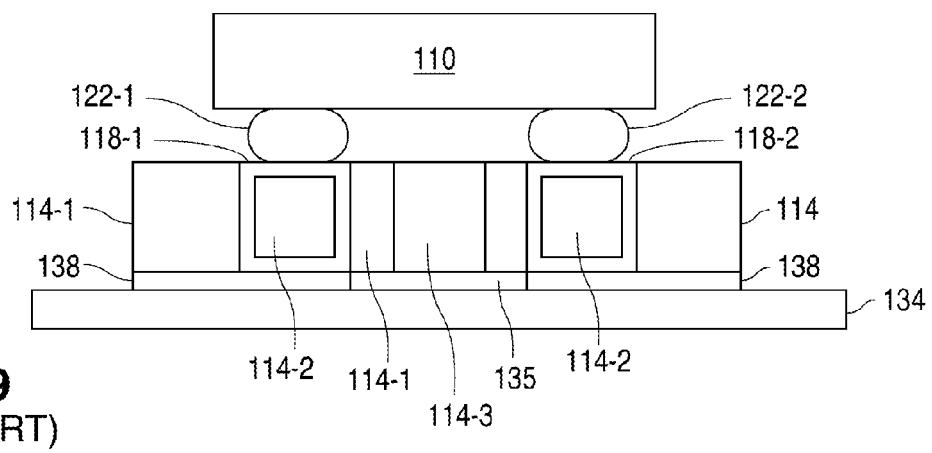
FIG. 9 illustrates a prior art device including an LED mounted on a submount.

As illustrated in FIG. 8, in some embodiments, the growth substrate 10 may be removed from the wafer of devices. The growth substrate 10 may be removed by any technique appropriate to the growth substrate material. For example, a sapphire growth substrate may be removed by laser melting or a mechanical technique such as grinding. Other substrates may be removed by wet or dry etching or mechanical techniques. In some embodiments, the growth substrate is thinned and a portion of the growth substrate remains attached to the wafer of devices. In some embodiments, the entire growth substrate remains attached to the wafer of devices.

After removing the growth substrate, the semiconductor structure may optionally be thinned, for example by photoelectrochemical etching. The surface of n-type region 12 exposed by removing the substrate may be roughened, patterned, or textured, for example by photoelectrochemical etching or any other suitable technique. Since light is extracted through the top of the device in the orientation illustrated in FIG. 8, roughening, patterning, or texturing the surface of n-type region 12 may enhance light extraction from the device.

One or more structures known in the art such as optics, wavelength converting layers, dichroic layers, or filters, may be disposed over the growth substrate 10, if present, or over the surface of n-type region 12 exposed by removing the growth substrate.

After the processing described above, the wafer of devices bonded to support substrates is diced into individual light emitting device chips, or groups of light emitting devices. Since the devices and support substrates are diced together, the support substrate is no wider than the device, as illustrated in the above figures. Singulation may be performed, for example, by conventionally sawing, by laser ablation using 193 nm, 248 nm, or 355 nm light, or by water jet cutting. Singulation may also be performed via a combination of scribing and mechanical breaking, scribing being performed, for example, by conventionally sawing, by laser ablation using 193 nm, 248 nm, or 355 nm light, or by water jet cutting.

The optional steps described in the text accompanying FIG. 8 may be performed before or after dicing the wafer of devices.

Since the above-described devices are bonded to the support substrates on a wafer scale, embodiments of the invention may provide efficiencies and cost reduction over conventional schemes in which the device is bonded to a support substrate die-by-die. For example, efficiencies may arise due to the possibility of wafer-level processing of LEDs through many processing operations typically performed at the package level in conventional LEDs including growth substrate removal, roughening of the semiconductor surface after growth substrate removal, and forming a wavelength converting layer.

In some embodiments, since the support substrate wafer includes no features at the time of bonding, the wafer of devices can be bonded to the support substrate wafer without detailed alignment. The device and support substrate wafers merely have to be roughly aligned, for example by visual alignment, but do not require fine alignment of patterned features on the two wafers. After bonding, the via etch mask has to be aligned to the LED metallizations, which can be performed through IR alignment (which looks through the bonded wafers) or backside alignment (which aligns a mask on the support substrate wafer side with a view of the LED pattern as seen through a transparent growth substrate such as sapphire).

The embodiments above describe the fabrication of light emitting device wafers. However, embodiments of the invention may be applied to the fabrication of any other wafer-processed device, particularly fabrication that involves bonding wafers of different CTEs. Examples include but are not limited to the fabrication of (1) MEMS resonators where bulk quartz is bonded to a silicon wafers, (2) semiconductor devices for power and high frequency applications comprising the 3D stacking of silicon with substrate materials of different thermal expansion such as, for example, GaAs, and (3) thick films of hybrid materials integrated on silicon wafers, such as integrated magnets or integrated inductors.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:
1. A method comprising:
   providing a wafer of semiconductor devices grown on a growth substrate, each semiconductor device comprising an n-type region and a p-type region, wherein the wafer of semiconductor devices has a first surface and a second surface opposite the first surface, wherein the second surface is a surface of the growth substrate;
   bonding the first surface to a first wafer, the first wafer comprising a body;

bonding the second surface to a second wafer, wherein the first and second wafer each have a different coefficient of thermal expansion than the growth substrate;

after bonding the first surface to the first wafer, for each semiconductor device, etching a first via through an entire thickness of the body to expose a metal electrically connected to the n-type region and etching a second via through an entire thickness of the body to expose a metal electrically connected to the p-type region;

after etching the first and second vias, removing the second wafer.

2. The method of claim 1 further comprising disposing a first metal layer in the first via and disposing a second metal layer in the second via, wherein the first and second metal layers electrically connect the first surface of the body to a second surface of the body opposite the first surface.

3. The method of claim 1 further comprising after removing the second wafer, removing the growth substrate.

4. The method of claim 1 wherein the growth substrate is sapphire and the first and second wafers are silicon.

5. The method of claim 1 wherein bonding the first surface to a first wafer and bonding the second surface to a second wafer occur in a single bonding step.

6. The method of claim 1 wherein bonding the first surface to a first wafer occurs before bonding the second surface to a second wafer.

7. The method of claim 1 wherein bonding the first surface to a first wafer occurs after bonding the second surface to a second wafer.

8. The method of claim 1 wherein the semiconductor devices comprise a III-nitride light emitting layer sandwiched between an n-type region and a p-type region.

9. The method of claim 1 wherein a first bonding layer is disposed between the first surface and the first wafer and a second bonding layer is disposed between the second surface and the second wafer.

10. The method of claim 9 wherein the first bonding layer bonds at a higher temperature than the second bonding layer.

11. The method of claim 9 wherein:
the first wafer is silicon and is bonded to the first surface by a first bonding material;
the second wafer is silicon and is bonded to the second surface by a second bonding material; and,
the second wafer is thicker than the first wafer.

12. A method comprising:
providing a wafer of semiconductor devices grown on a growth substrate, wherein the wafer of semiconductor devices has a first surface and a second surface opposite the first surface, wherein the second surface is a surface of the growth substrate;
bonding the first surface to a first wafer; and
bonding the second surface to a second wafer, wherein the second wafer is configured to reduce warp in the wafer of semiconductor devices caused by bonding to the first wafer;
wherein a thickness of the second wafer satisfies $[(CTE_{growth}-CTE_{second})(T_{bond1}-T_{room})(E_{second})]/[(1-v_{second})(t_{second})]=[(CTE_{growth}-CTE_{first})(T_{bond2}-T_{room})(E_{first})]/[(1-v_{first})(t_{first})]$, where $CTE_{growth}$ is a coefficient of thermal expansion of the growth substrate, $CTE_{second}$ is a coefficient of thermal expansion of the second wafer, $CTE_{first}$ is a coefficient of thermal expansion of the first wafer, $T_{room}$ is 25° C., $T_{bond}$ is a bonding temperature of the bond between the wafer of semiconductor devices and the second wafer, $T_{bond2}$ is a bonding temperature of the bond between the wafer of semiconductor devices and the first wafer, $E_{second}$ is a Young's modulus of the second wafer, $E_{first}$ is a Young's modulus of the first wafer, $V_{second}$ is a Poisson's ratio of the second wafer, $v_{first}$ is a Poisson's ratio of the first wafer, $T_{second}$ is a thickness of the second wafer, and $T_{first}$ is a thickness of the first wafer.

\* \* \* \* \*